United States Patent [19]
Kroger

[11] Patent Number: 5,981,869
[45] Date of Patent: Nov. 9, 1999

[54] REDUCTION OF SWITCHING NOISE IN HIGH-SPEED CIRCUIT BOARDS

[75] Inventor: Harry Kroger, Vestal, N.Y.

[73] Assignee: The Research Foundation of State University of New York, Binghamton, N.Y.

[21] Appl. No.: 08/697,710

[22] Filed: Aug. 28, 1996

[51] Int. Cl.⁶ ................................................. H05K 9/00
[52] U.S. Cl. .................. 174/35 R; 174/255; 361/816
[58] Field of Search ............................. 174/35 R, 35 MS, 174/250, 253, 254, 255, 261, 262, 265; 361/778, 792, 816, 818; 333/238, 246, 81 R, 12

[56] References Cited

U.S. PATENT DOCUMENTS

| | | | |
|---|---|---|---|
| 3,765,912 | 10/1973 | Gates, Jr. et al. | 501/88 |
| 5,367,956 | 11/1994 | Fogel, Jr. | 102/202.2 |
| 5,428,506 | 6/1995 | Brown et al. | 361/794 |
| 5,594,218 | 1/1997 | Diaz et al. | 181/295 |

*Primary Examiner*—Kristine Kincaid
*Assistant Examiner*—Hung V. Ngo

*Attorney, Agent, or Firm*—Salzman & Levy

[57] ABSTRACT

The present invention features a method of noise reduction in both packaging structures and circuit boards, as well as articles of manufacture that result from this method. Both the method and the articles weaken and effectively reduce undesirable noise signals that propagate as waves to and from the perimeter of circuit boards. The method of the invention adds absorbent materials in various structural configurations to strategic areas about the exterior and interior of the circuit boards. In order to absorb noise signals, these added materials are placed around lines and vias of the circuit boards, as well as at their ends and perimeters. Non-absorbent materials must contiguously surround the lines and vias; otherwise, absorbent material will absorb desired signals, as well as noise. The method of this invention tries to match the dielectric constant of the added, absorbent materials with the dielectric constant of the non-absorbent, dielectric materials found on the circuit board. The absorbent materials are known as "lossy" dielectrics, and are chosen in some instances for their magnetic, rather than their electric, absorption properties.

5 Claims, 12 Drawing Sheets

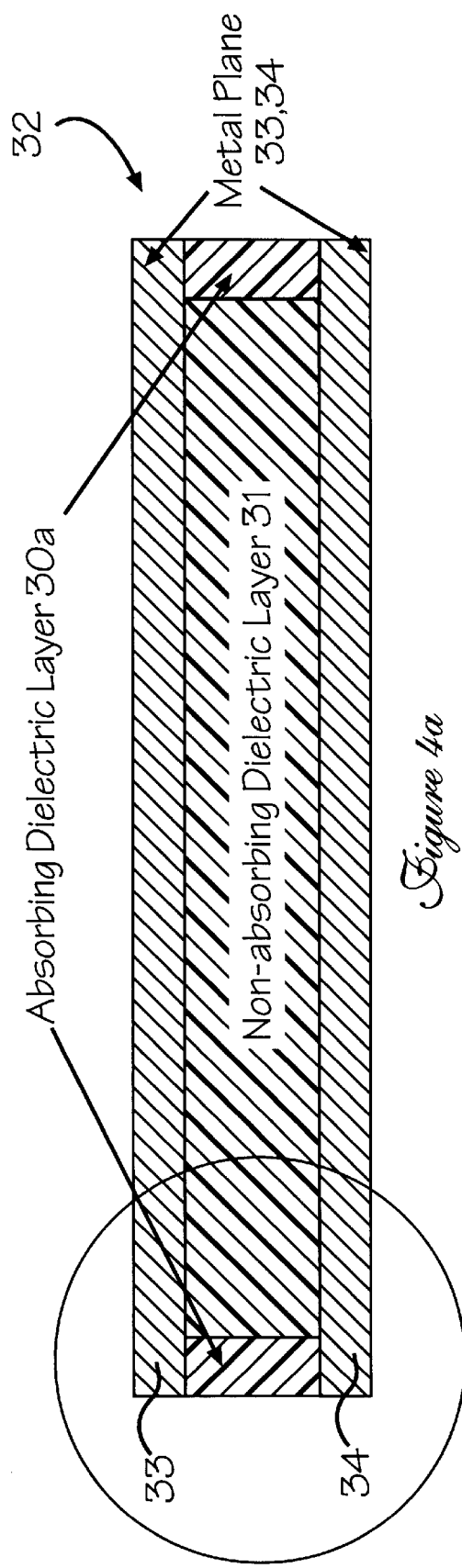
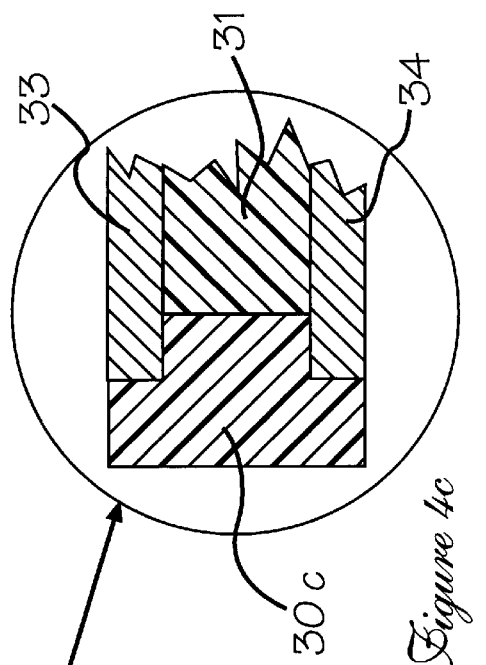
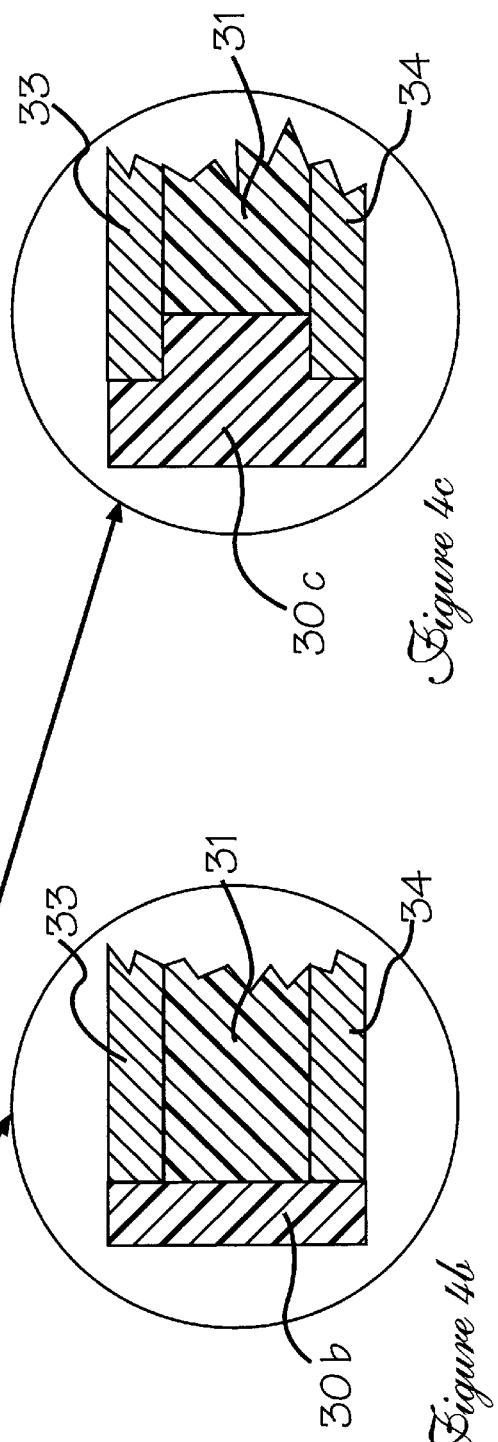

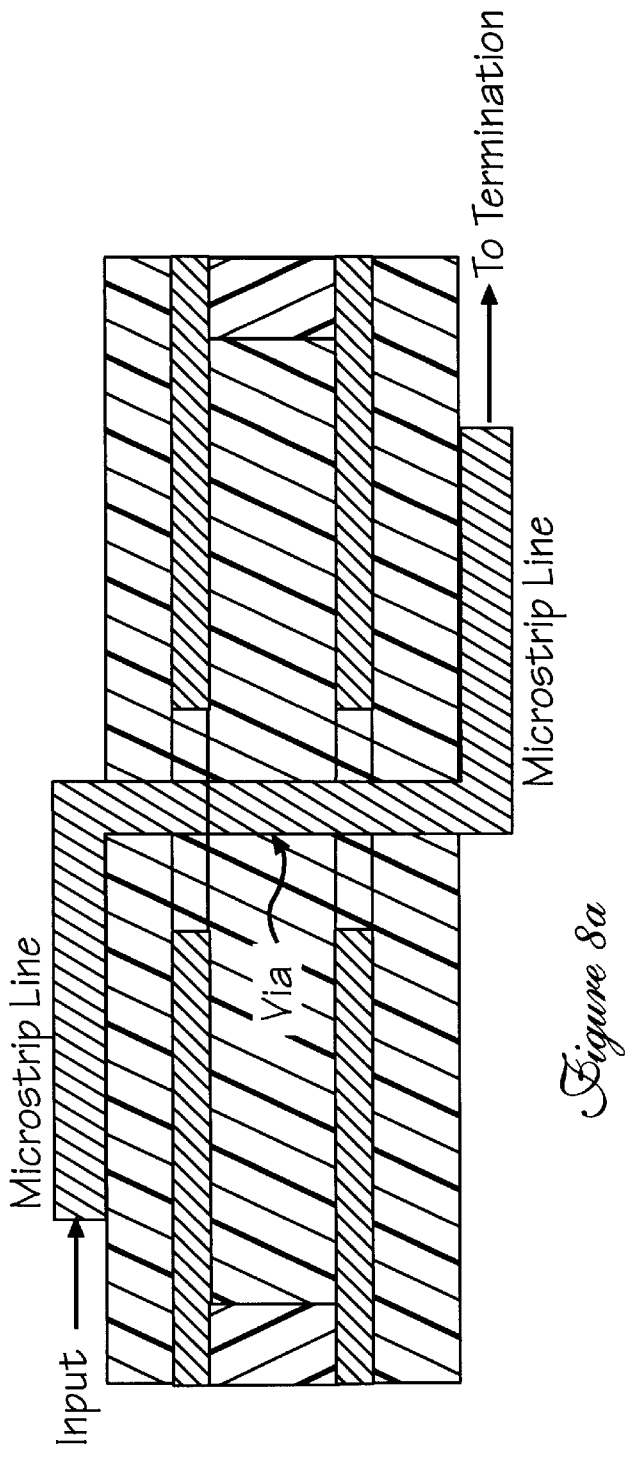
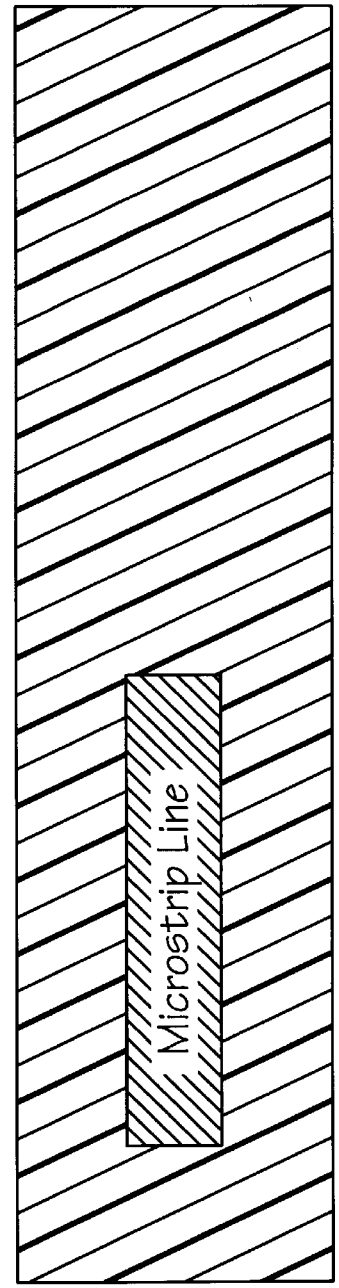
Figure 8a
Figure 8b

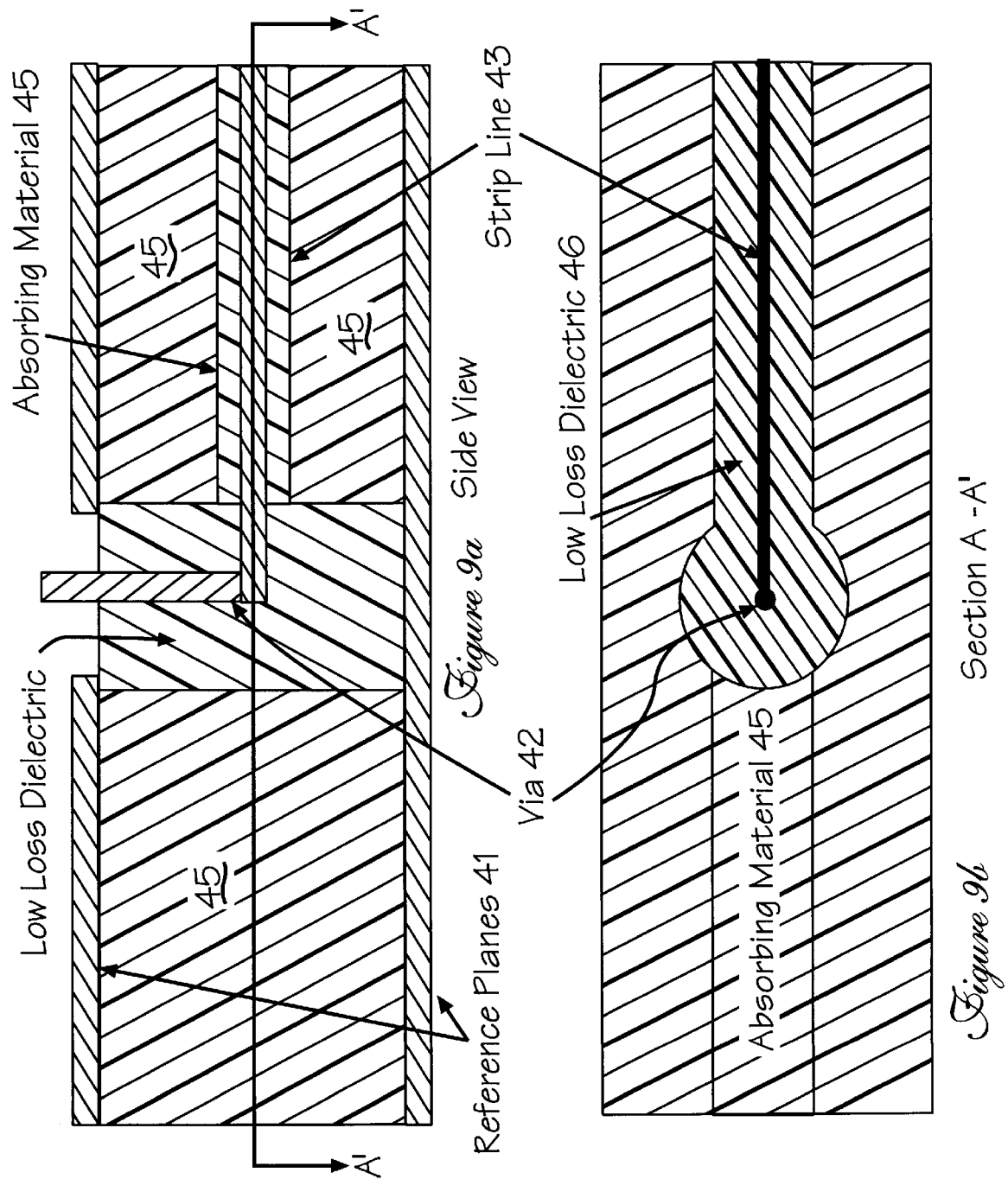

REDUCTION OF SWITCHING NOISE IN HIGH-SPEED CIRCUIT BOARDS

FIELD OF THE INVENTION

The present invention pertains to the reduction of "delta-I noise" in both digital and RF electronics systems, and, more particularly, in high-performance electronics systems such as digital systems and high-speed circuit boards that can have their performance limited by switching noises. Switching noise is also sometimes called "simultaneous switching noise", "delta-I noise", "LdI/dt noise", "ΔI-noise" or "ground bounce".

BACKGROUND OF THE INVENTION

The explanation for low-frequency switching noise is usually attributed to the switching of the logic gates in electronic circuits. When these gates switch, they draw more currents This change in current develops a voltage of V=LdI/dt (where L is the inductance, I is the current, and t is the time), for some non-zero inductance always exists, through which extra current must be supplied.

Both the understanding of and the method of modeling delta-I noise has recently been elucidated by Jiayuan Fang et al, in a series of journal publications. Experimental confirmation of the modeling approach has been affirmed by a collaboration between Jiayuan Fang and IBM Microelectronics of Endicott, New York. "A New Approach to Signal Integrity Analysis of High-Speed Packaging" by Yuhze Chen, Zhaoqing Chen, Khonghua Wu, Danwei Xue, and Jiayuan Fang, Proceedings of the 1995 IEEE 4th Topical Meeting on Electrical Performance of Electronic Packaging, pp. 235–238.

In designing high-speed switching and high clock rates for electronic circuits, Fang's insights are important, particularly where the wavelength of the switching noise corresponds to components of the highest frequency, and where it is comparable to, or even smaller than, the dimensions of such circuits. In particular, it has been shown that the previous, low-frequency description or understanding of delta-I noise as LdI/dt is inadequate. Rather, delta-I noise must now be considered as a propagating wave between the conducting planes of the circuit boards.

The present invention has as its objective the reduction of undesirable reflections of power-supply-induced fluctuation signals as they strike the perimeter of a circuit board. These undesirable signals can arise, for example, from current surges in vias supplying power to chips. These signals propagate in a radial-mode waveguide, as suggested by Fang.

This invention also has as its objective the attenuation of such undesirable signals as they propagate to and from the perimeter of the circuit board. Such signals would affect the magnitude of the undesired signal at other vias disposed upon the circuit board.

SUMMARY OF THE INVENTION

In accordance with the present invention, there are provided a method of noise reduction in packaging structures and circuit boards, as well as articles of manufacture resulting therefrom. Both this method and its articles of manufacture attenuate and effectively reduce undesirable noise signals that propagate as waves to and from the perimeter of circuit boards. The method of the invention adds absorbent materials in various structural configurations to strategic areas about the exterior and interior of the circuit boards. In order to absorb noise signals, these added materials are placed around lines and vias of circuit boards, as well as at their ends and perimeters thereof. Non-absorbent materials must contiguously surround the lines and vias; otherwise, absorbent material will absorb desired signals, as well as noise.

The method of this invention tries to match the dielectric constant of the added, absorbent materials with the dielectric constant of the non-absorbent, dielectric materials disposed on the circuit board. The absorbent materials are known as lossy dielectrics, and are chosen in some instances for their magnetic (rather than their electric) absorption properties. As such, these materials are excellent insulators, having resistivities in an approximate range of between $10^{10}$ and $10^{12}$ ohm-cms. Because of this high resistivity, these absorbent materials can be placed between AC reference planes having different DC potentials, without drawing any significant DC power. Absorbent materials that do not have the aforesaid high resistivity can also be used; however, for best performance, they are limited to being placed between AC reference planes that have the same DC potential. Placing a conductive layer between conducting plates having different DC potentials results in DC power consumption, of courses. This extra power consumption, if not desired, can be eliminated by inserting one or more insulative layers, in order to block the DC path, as described hereinbelow, with reference to FIG. 13.

Materials that can be used in this invention include reticulated vitreous carbon, silicon carbide, organic polymeric conductors, properly doped semiconductors and ceramic foams. In general, one or more layers of insulative materials can be placed between the conducting planes and the lossy dielectric. Such insulators must satisfy the requirement of $\omega CR \gg 1$, where $\omega$ is the lowest angular frequency of interest, C is the capacitance of one of the thin insulating layers, and R is the resistance of the absorbing dielectric C is given as $C=KA/t$, where K is the dielectric constant of the absorbing material insulator, t is the thickness of the insulating layers, and A is the area. The term R is given as $R=\rho d/A$, where $\rho$ is the resistivity of the conducting material, d is the thickness, and A is the area.

BRIEF DESCRIPTION OF THE DRAWINGS

A complete understanding of the present invention may be obtained by reference to the accompanying drawings, when considered in conjunction with the subsequent, detailed description, in which:

FIG. 4a depicts a schematic, sectional view of a basic circuit structure in accordance with this invention;

FIGS. 4b and 4c respectively show partial, sectional views of alternate embodiments of the absorbent material used in the circuit structure depicted in FIG. 4a;

FIGS. 8a and 8b respectively illustrate schematic, cross-sectional and top views of a schematic circuit structure fabricated in accordance with the invention;

FIG. 9a depicts a side, sectional, schematic view of a circuit structure having internal absorption materials disposed therein, in accordance with this invention;

FIG. 9b shows a sectional view of the schematic circuit structure illustrated in FIG. 9a, taken along lines A—A;

DESCRIPTION OF THE PREFERRED EMBODIMENT

Generally speaking, the invention features both a method and articles manufactured in accordance therewith for reducing switching noise in electronic circuits The invention reduces undesirable reflections of power-supply-induced fluctuation signals as they strike the perimeter of circuit boards. These undesirable signals can arise, for example, from current surges in vias supplying power to chips; they thus propagate, as in a radial-mode waveguide. This invention also encompasses the attenuation of such signals as they propagate to and from the perimeter of the circuit board, so that they will reduce the magnitude of undesired signals at other vias or sites about the circuit board.

Figure 1:
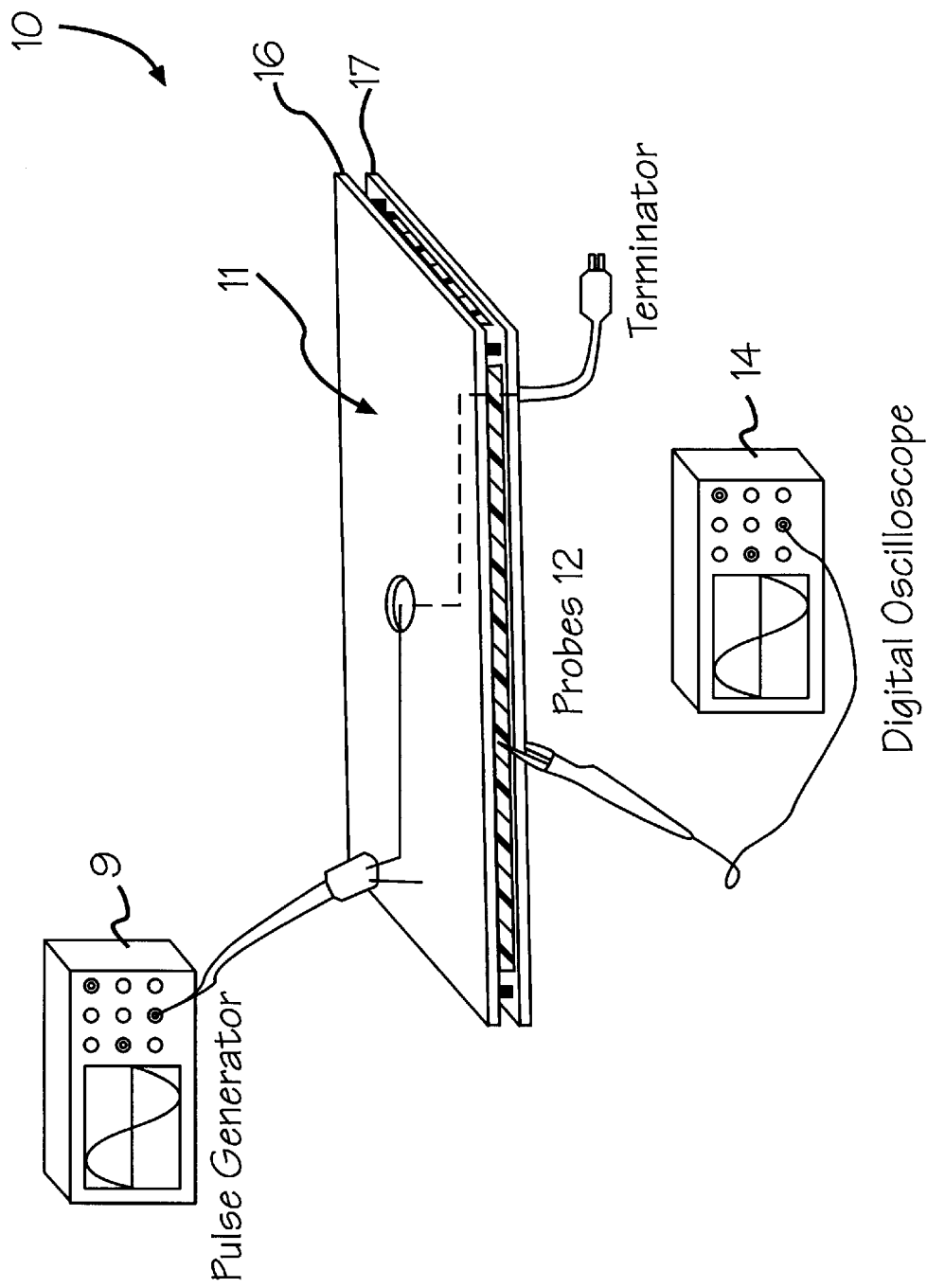
FIG. 1 illustrates a schematic diagram of a testing apparatus that is used to measure voltage fluctuations in circuit boards being tested in accordance with the invention.

Now referring to FIG. 1, a schematic diagram of a testing circuit arrangement 10 for use in this invention is illustrated. A pulse generator 9 feeds a signal to the circuit board 11. Probes 12 connected to the respective peripheral edges of planes 16 and 17 of the circuit board 11 transmit the resulting signal of the propagating wave at the perimeter of the circuit board 11 to the digital oscilloscope 14.

Figure 2:
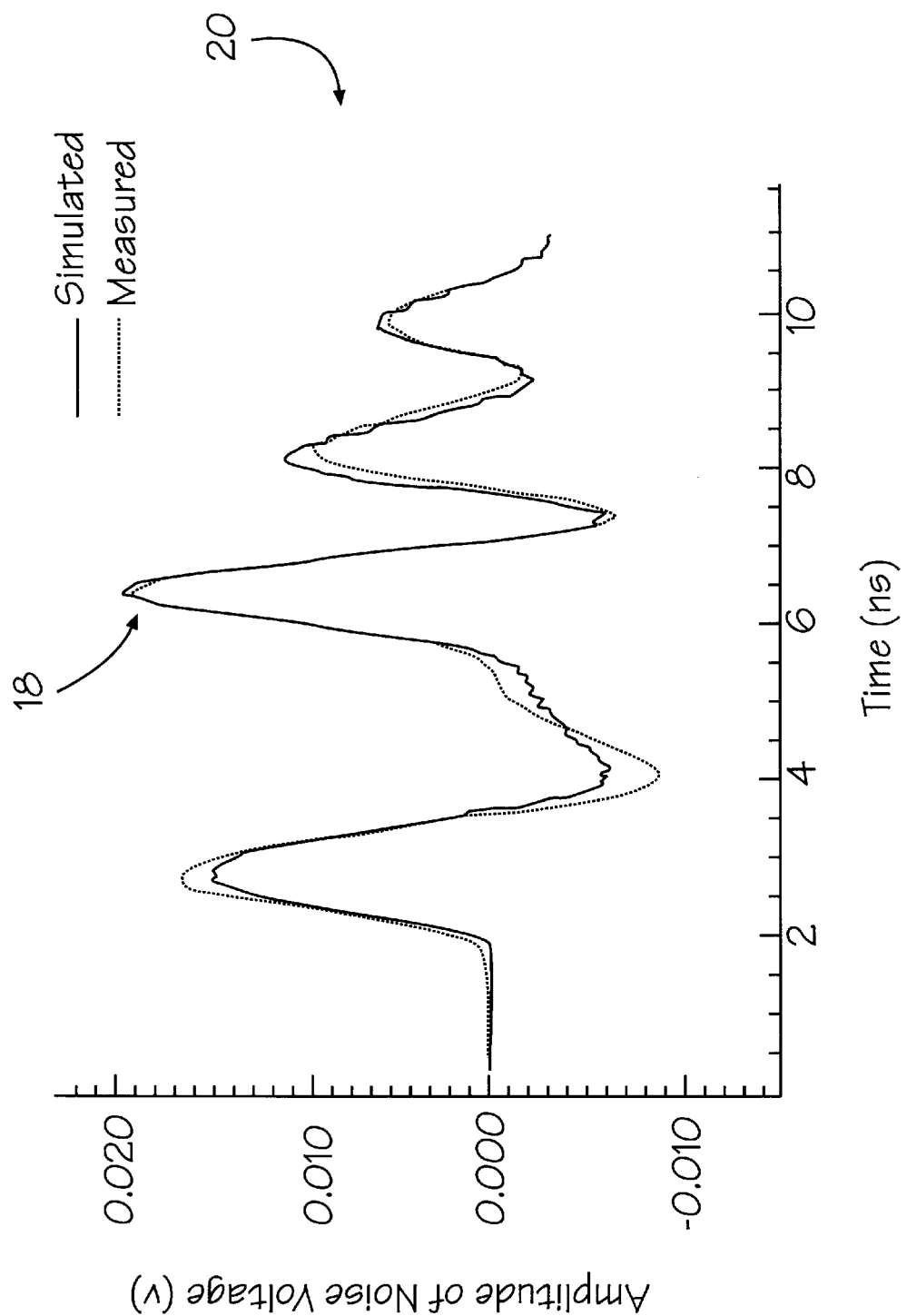
FIG. 2 depicts a graph that compares measured and simulated voltage fluctuations on the planes of the circuit boards being tested by the apparatus shown in FIG. 1.

FIG. 2 depicts a graph 20 of the test results obtained by the testing apparatus 10 depicted in FIG. 1 above. The graph 20 shows that the largest switching signal is received at a time when the low frequency in theory (V=dI/dt) predicts a zero signal This largest signal, the second maximum peak 18, results from the propagation of the signal guided by the respective conducting planes 16 and 17 (as in a radial-mode waveguide) to the edges of the circuit board 11; it is subsequently reflected to the receiving point.

Figure 3:
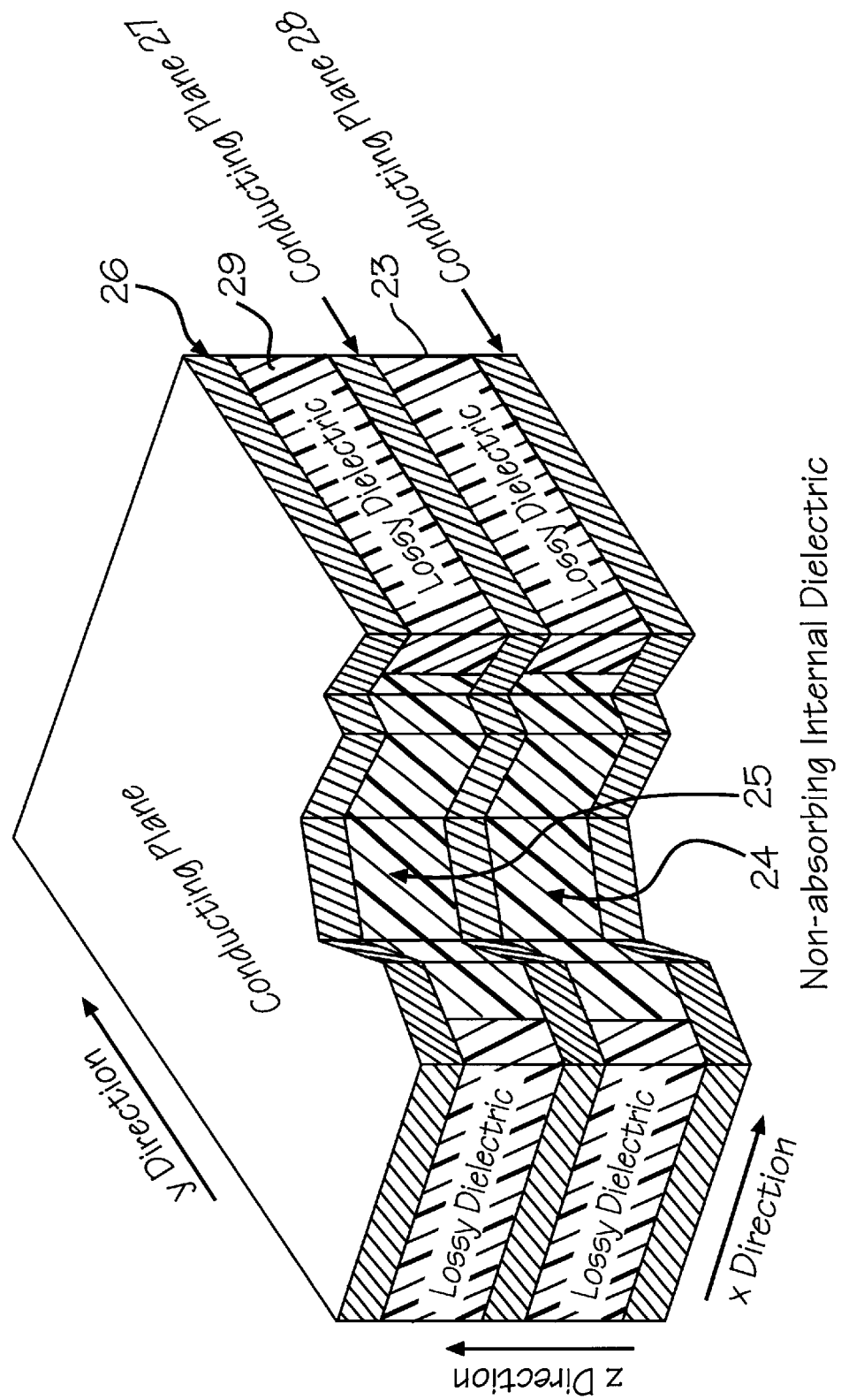
FIG. 3 illustrates a perspective, cut-away, schematic diagram of a circuit fabricated in accordance with the principles of this invention.

Referring to FIG. 3, a schematic, perspective view of a circuit structure in accordance with this invention is shown. A multi-layered circuit board 22 is depicted. Each respective, dielectric layer 24 and 25 is sandwiched between adjacent conducting planes 26, 27 and 28. The dielectric layers 24 and 25 respectively consist of an inner portion that is made of a conventional, non-absorbent (loss-less), dielectric material, which is surrounded at the perimeter by an absorbent (lossy), dielectric material 23 and 29, respectively. Various methods of how these absorbent layers 23 and 29 can be geometrically designed into the gcircuit-board structure are described hereinafter.

Referring to FIG. 4a, a first embodiment of the fabrication of the noise-absorbent layer 30a into the circuit 32 is illustrated. The simplest of these types of absorbent structures is shown in this cross-section, in which only a single, dielectric strip is formed at the periphery of the non-absorbent, dielectric material 31. In this structure the absorbent (lossy), dielectric 30 is placed only at the perimeter of the printed circuit board. In FIG. 4a, the layer 30a is shown disposed between the metal planes 33 and 34. FIGS. 4b and 4c depict alternative embodiments 30b and 30c, respectively, of the absorbent, dielectric layer 30 shown in FIG. 4a.

Figure 5:
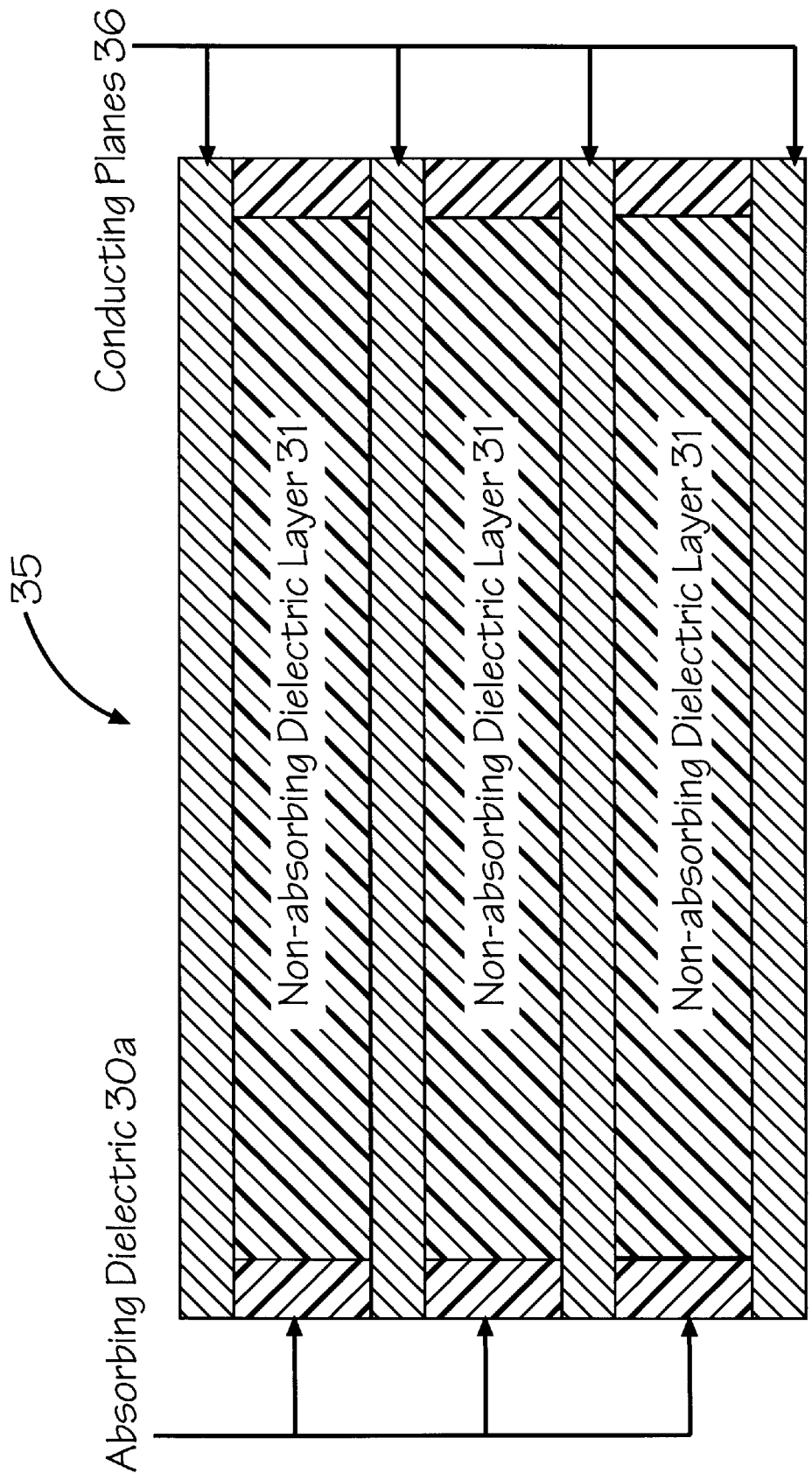
FIG. 5 illustrates a schematic, sectional view of absorbent materials placed between conducting planes of a circuit board, in accordance with this invention.

Referring to FIG. 5, a cross-sectional structure 35 of three or more conducting planes 36 comprises the entire circuit board. The absorbent material 30a is placed at the perimeter of the non-absorbent, dielectric layer 31, as well as between every pair of conducting planes 36, as illustrated. The dielectric geometry at the perimeter of the circuit corresponds to the structure depicted in FIG. 4a.

Figure 6:
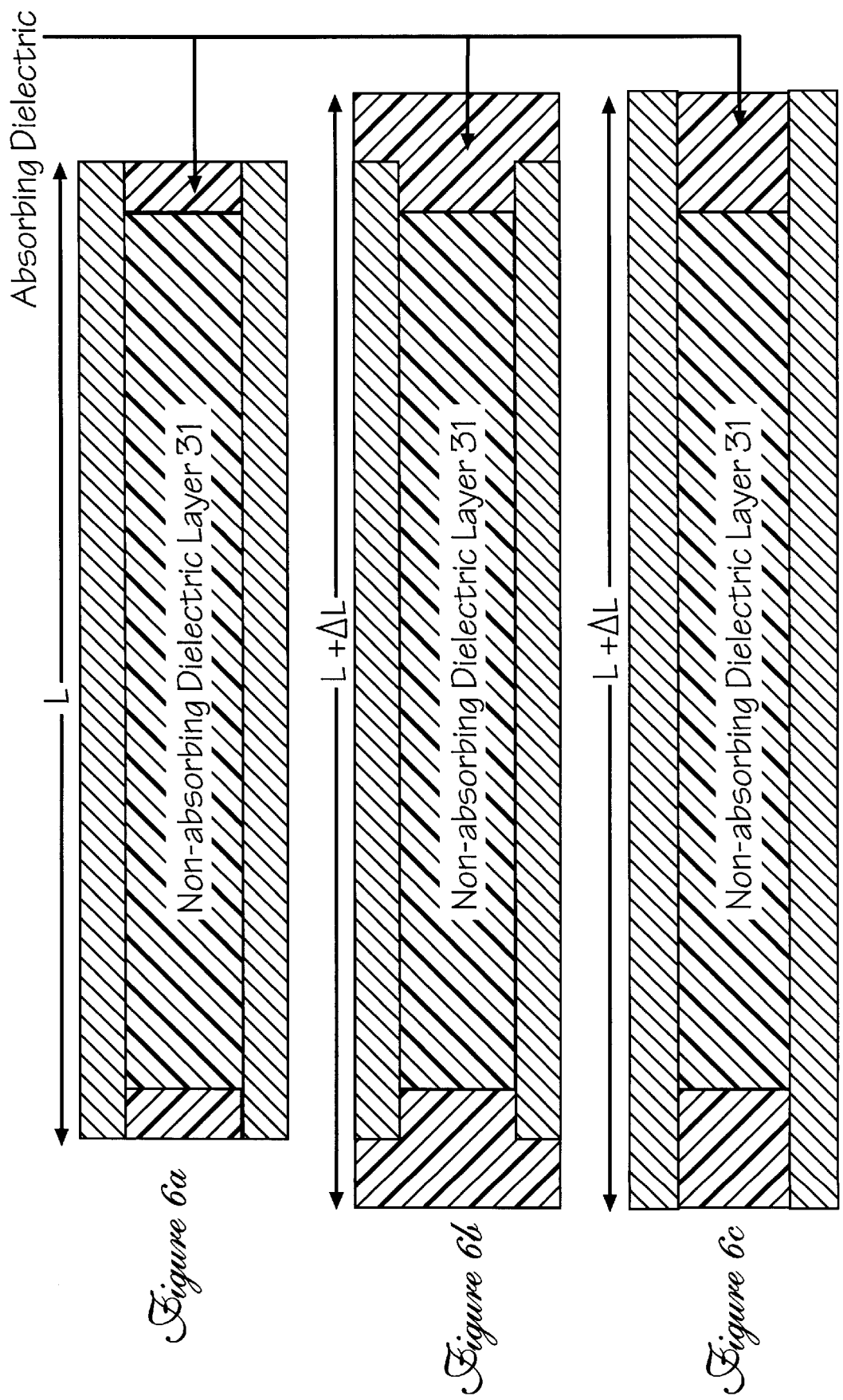
FIGS. 6a, 6b and 6c depict three respective, schematic, sectional views of different embodiments for positioning absorbent materials at the ends of circuit planes.

Referring to FIG. 6b, the absorbent material has additional length (and width), when compared with the basic design illustrated in FIG. 6a. FIG. 6c presents an alternative design having the same length as the structure of FIG. 6b, but also having a greater length (and width) of the conducting planes, as well.

Figure 7:
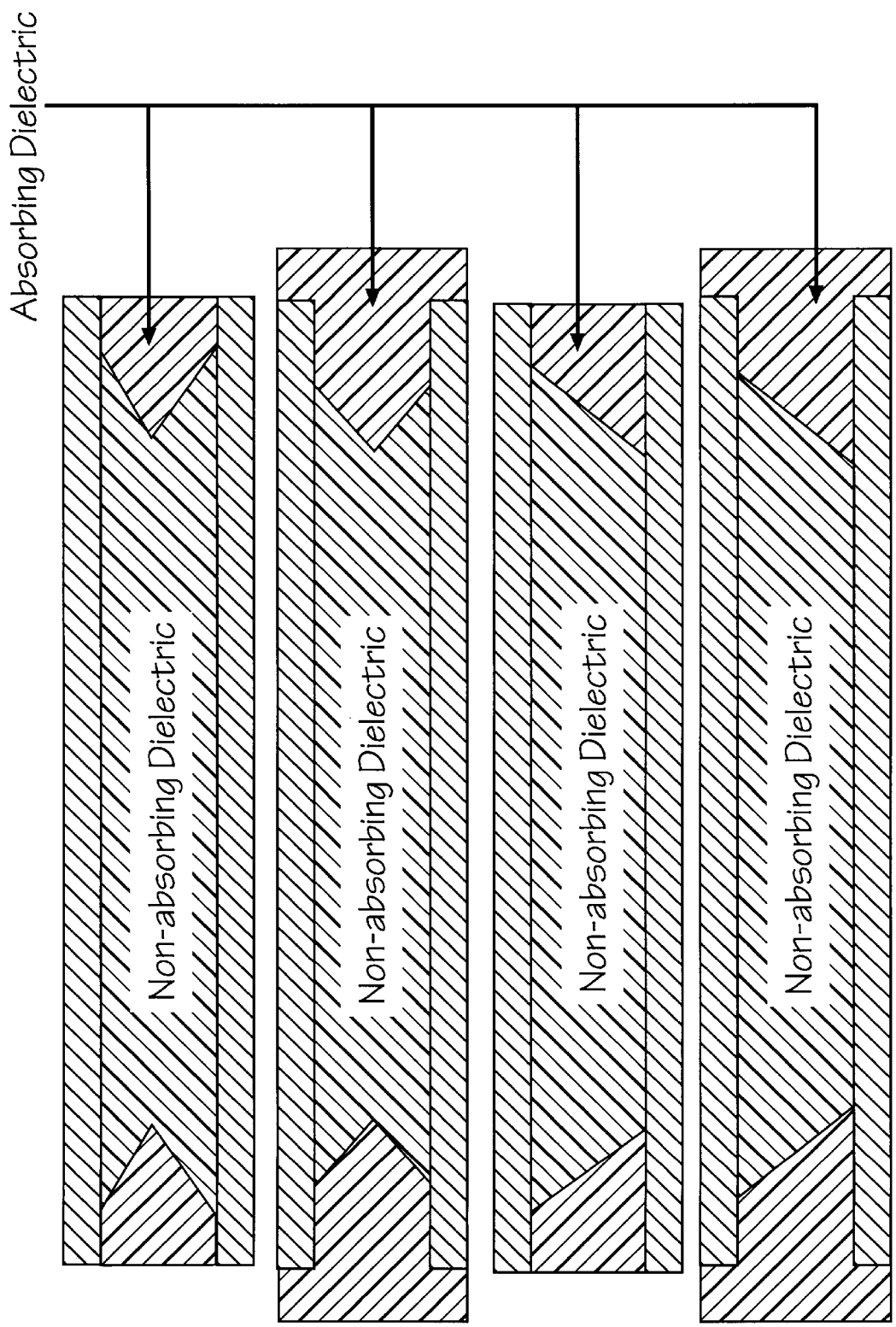
FIG. 7 shows four respective, schematic, sectional views of four additional embodiments for positioning absorbent materials at the ends of the circuit planes depicted in FIGS. 6a through 6c.

It is possible to reduce the reflections from any interface between different dielectrics by avoiding an abrupt transition between them For example, it is a common practice in implementing absorbers in waveguides to taper their cross-sections from narrow (often zero) thicknesses to wider ones, sometimes filling the entire cross-section of the guide. This results in a gradual transition of the effective dielectric constant. This scheme can also be implemented in principle for the radial-mode waveguide of circuit boards, as illustrated in the four embodiments of FIG. 7. The first and third structures of FIG. 7 function in a similar manner, while the second and fourth structures illustrated in FIG. 7 are similar alternatives to those depicted in the first and third structures, respectively. The second and fourth structures are related to the first and third structures, much as the structure shown in FIG. 4c is related to that depicted in FIG. 4a.

While the tapering of the absorbent and non-absorbent dielectrics usually provides some absorption improvement, the benefit is usually not worth the added manufacturing expense. In order to reduce reflections by using a gradation in the dielectric constant, the gradient in the dielectric constant should effectively extend over a distance greater than a wavelength of the radiation. The highest-frequency components of the undesired pulses are, in the present technology, well under 10 GHz. Therefore, a sufficiently gradual gradient should extend about 3 cm. It is also necessary to suppress the effects of 100-MHz-components of these pulses. This requires employing a gradual gradient over a distance of 300 cm. Clearly, even the 3-centimeter distance becomes impractical, because of the size constraints of many of the circuit board products. However, as switching speeds and clock rates increase (as they steadily have over the past decade), the tapering of the effective dielectric constant could conceivably become important.

Referring to FIGS. 8a and 8b, respectively, an embodiment is shown that is closely related to the theoretical and experimental results depicted in FIGS. 1 and 2. The reflection of the signal is reduced in this embodiment. As is fully explained hereinbelow, this (and the related structures of FIGS. 3 through 7) is the preferred embodiment of this invention. The lossy dielectric is placed between every pair of conducting planes at the perimeter of a circuit board that contains two or more conducting planes, as illustrated in FIGS. 3 and 5.

This invention will not reduce the unwanted reflected signals to zero or even to an absolute minimum. It is inherently impossible to exactly match the real, dielectric constant of the non-absorbent, dielectric material to the complex, dielectric constant of the absorbent material. Furthermore, the reflection from the interface between the non-absorbent and absorbent materials is a function of the angle of incidence of the wave. The essence of this invention, however, is based on the fact that appropriate, absorbent material reduces reflections. This is of considerable benefit, despite the fact that the reflections are not reduced to zero.

There are other ways to incorporate absorbent materials other than at the perimeter of the circuit board. FIGS. 9a and 9b respectively illustrate a circuit-board scheme in which most of the dielectric material between two reference planes 41 consists of highly-absorbent material 45. Low- loss, dielectric material 46 is placed only in the immediate vicinity of vias 42 and strip lines 43, respectively. This scheme has the advantage of providing more lossy material, and tends to attenuate radial waves that will be launched from the vias, before they reach the perimeter of the circuit board. This approach, therefore, reduces the interaction between vias before reflection from the perimeter even occurs. It is important to not bring the highly-absorbent material too close to the strip lines 43 or the vias 42, else absorbent material will also attenuate the desired signals as they travel along the strip-line interconnections. A rough guide is to not allow the highly-absorbent material 45 to approach by a distance that is closer than three times the width of the lines 43 and vias 42.

The only practical disadvantage that this complexity adds to the manufacture is its added cost. It also adds certain theoretical complications which are in practice possible to deal with. While, in principle, a perfect match is desired in dielectric constant between the highly lossy and loss-less materials, in practice this cannot be perfectly achieved. Therefore, there will be some reflections for all boundaries between lossy and loss-less materials. These additional internal reflections offer a complication in fully modeling any specific configuration.

Figure 10A:
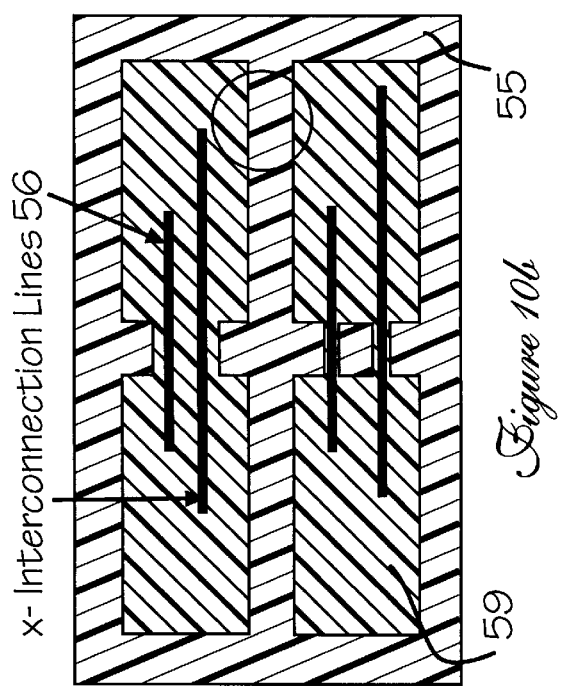
FIGS. 10a through 10d respectively show sectional views of the internal structure of circuits featuring the absorbent materials of this invention.
Figure 10B:
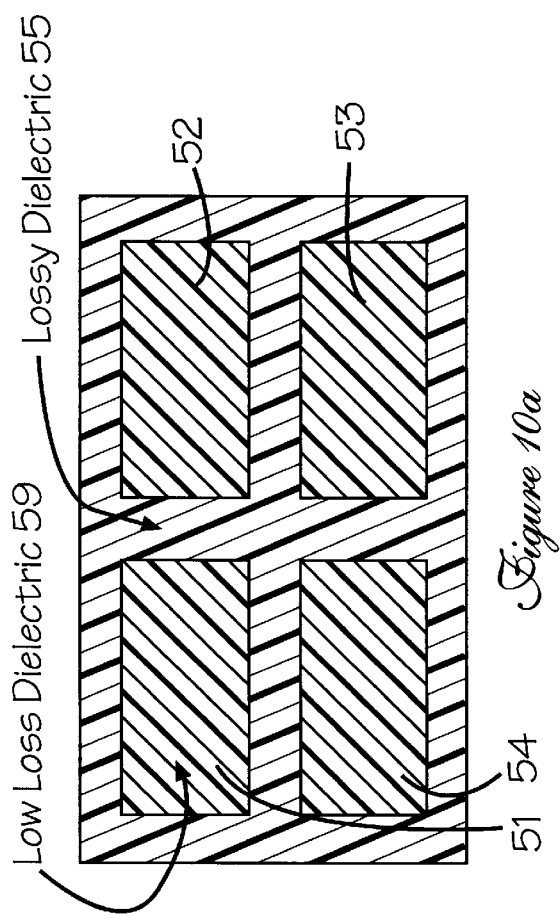
Figure 10D:
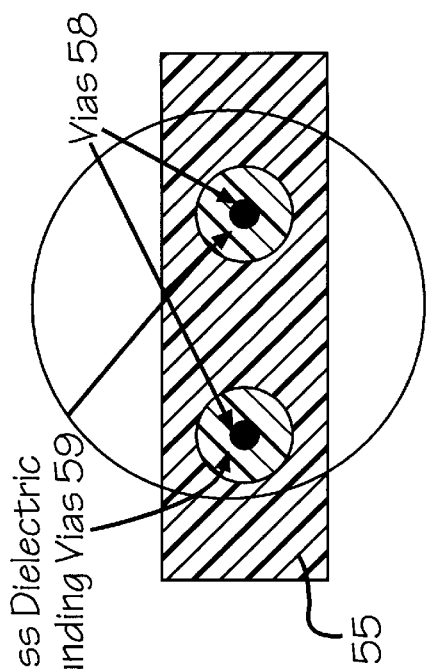
Figure 10C:
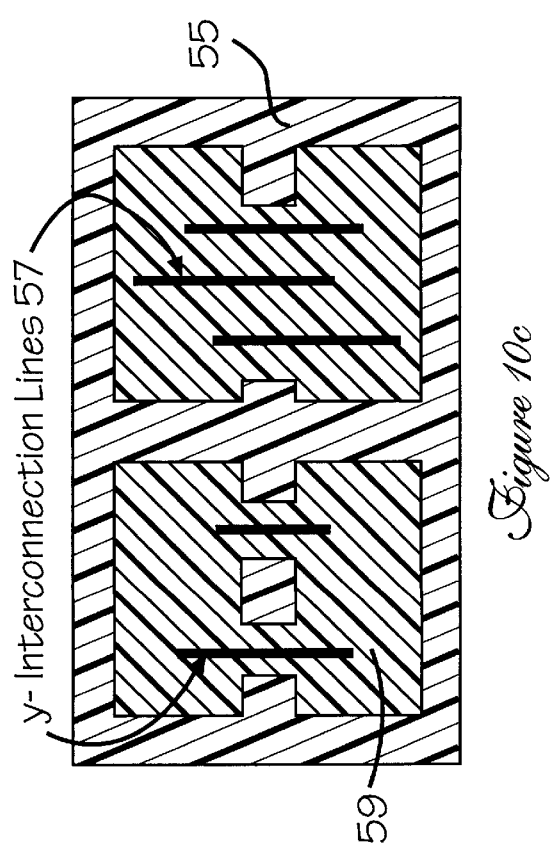

Other ways can be used to incorporate the lossy material without trying to use it at substantially all locations internal to the perimeter of the circuit board. Examples are presented in FIGS. 10a through 10d, as well as in FIG. 11. FIG. 10a shows a plan view, i.e., the approximate isolation of four quadrants 51, 52, 53 and 54 of the circuit board from one another by means of lossy dielectrics 55. Other simple divisions are possible, such as the use of diagonals, circles, etc. This structure is less expensive to design and manufacture than the structure shown in FIG. 9, because it is less complex. In general, signals must propagate between quadrants; therefore, the overall design concept must be modified to permit this. How this may be accomplished is illustrated in FIG. 10b and 10c, in which the dielectric structures are used for x- and y-signal lines 56 and 57, respectively. Actual structures are more complex than those shown; this illustration is only for the purpose of teaching a simple understanding of the inventive concept. It is also necessary to run vias 58 through the area occupied by the lossy dielectric 55. In such a case, the vias 58 should be surrounded by low-loss dielectric 59, as shown in FIG. 10d.

Figure 11:
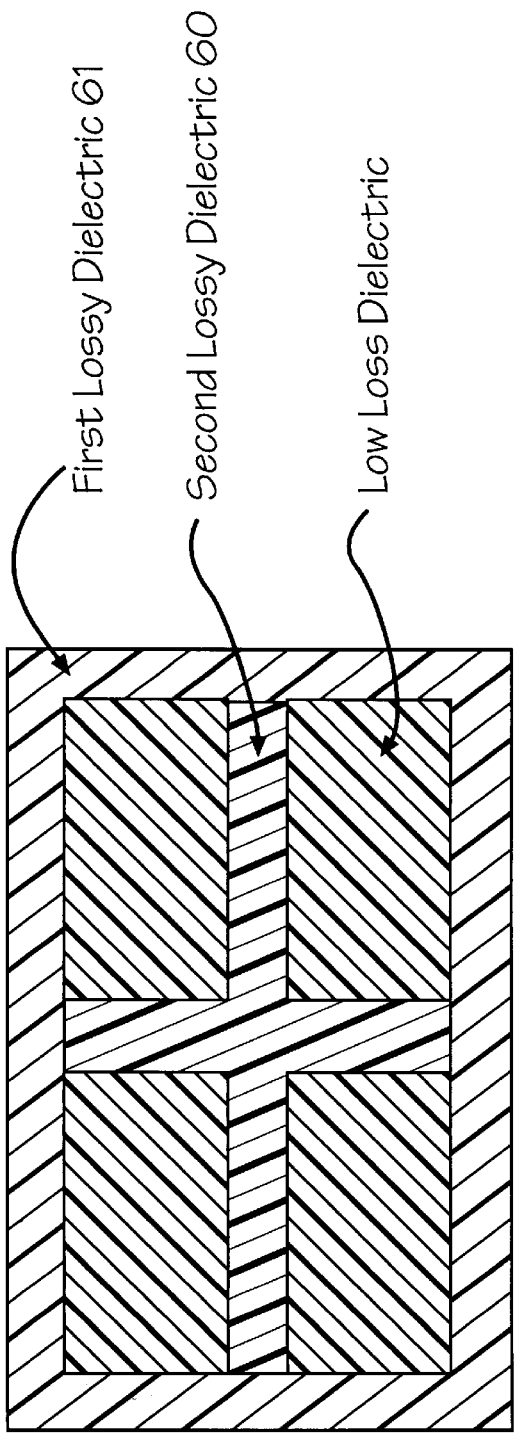
FIG. 11 depicts a sectional, schematic view of an alternate embodiment of the internal structure illustrated in FIGS. 10a through 10d.

Referring to FIG. 11, a minor variation of the structure illustrated in FIGS. 10a through 10d is shown. Here the "internal", lossy dielectric 60 has different material properties that are different from the external, lossy dielectric 61 located at the perimeter of the circuit board. Multiple, absorbent dielectrics reduces the reflections from the internal boundaries, but at the cost of reduced internal attenuation.

Figure 12:
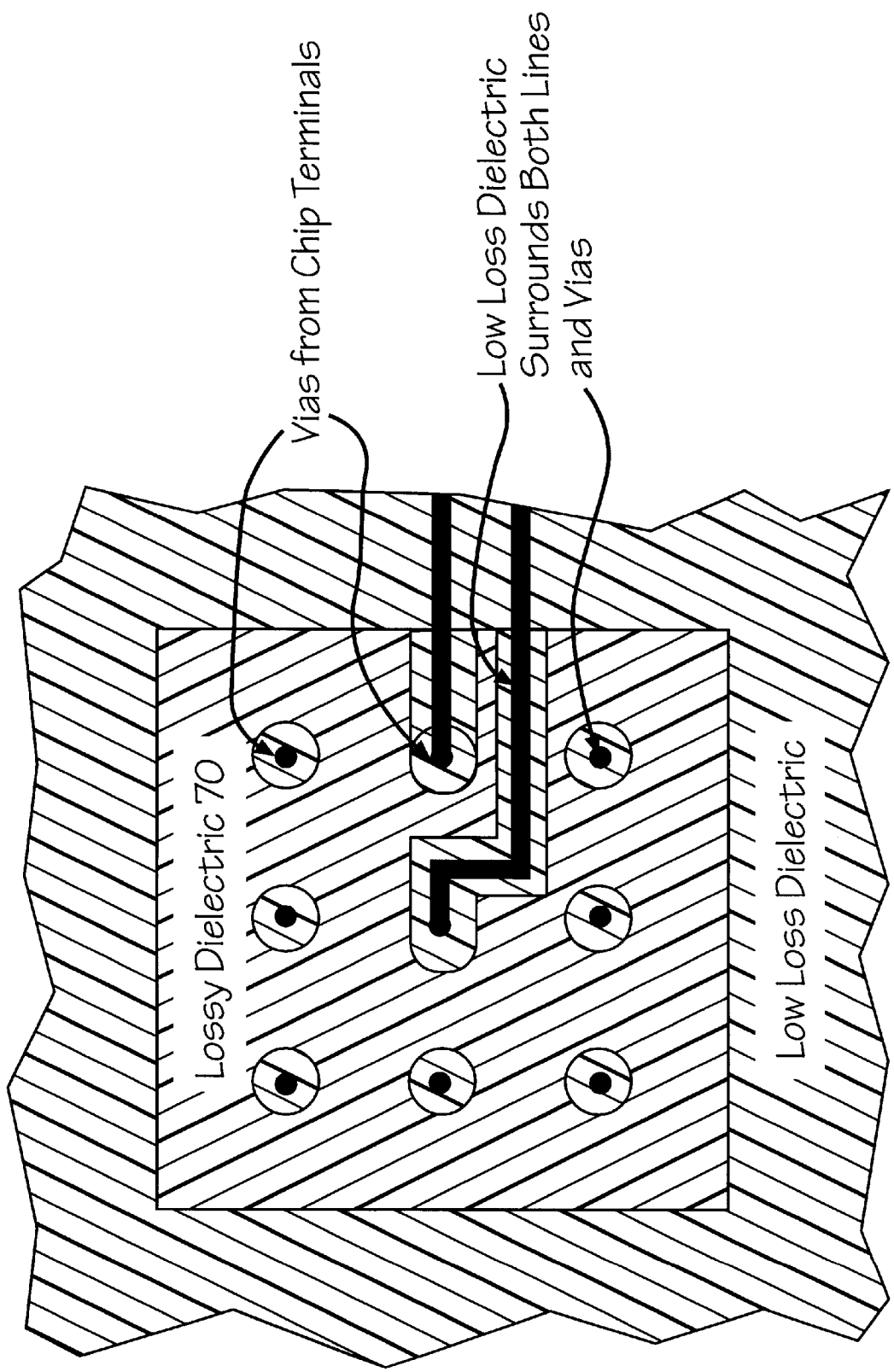
FIG. 12 depicts a sectional, schematic view of an X-Y plane of a circuit board, in accordance with the invention.

Referring to FIG. 12, a final variation in the use of "internal", lossy dielectrics is shown. In this case, the "internal" dielectric 70 is used to isolate a particularly noisy chip, or set of chips, from the rest of the system. Alternatively, this structure could be used to isolate a particularly sensitive chip from the noise of the rest of the system. It can serve both functions simultaneously. The special chip can have either an area array, or a peripheral array, of input/output pins (pads).

There are two reasons for preferring that lossy dielectrics be placed solely about the perimeter. First, manufacturing processes are simplified, if the absorbent material is added only at the perimeter of the circuit board. It could be added as a final, room-temperature step in the manufacturing process, for example, so that its thermal properties do not interfere with the rest of the assembly procedures. Second, the addition of a lossy dielectric at the perimeter to reduce reflections therefrom can be achieved without adding any new reflecting surfaces. It should be understood that new reflecting surfaces are added when interfaces are introduced between the lossy and non-lossy materials at boundaries that are well inside the perimeter of the circuit board.

It is not the purpose of this description to discuss the optimal choice for the absorbent, dielectric material. However, it is important to point out that several different choices of material are useful. One possible choice is a variation of Eccosorb™ material. Many of these materials depend upon magnetic, rather than electric, absorption and, therefore, are excellent insulators, having resistivities in the range of between $10^{10}$ and $10^{12}$ ohm-cms. Materials with such high resistivities can be used between AC reference planes that have different DC potentials, without drawing any significant DC power. Some Eccosorb materials apparently have real parts of their relative dielectric constants K that are approximately equal to that of FR4 boards (K=4). This tends to reduce reflections from the interface between FR4 dielectric and the Eccosorb material, a desirable property.

There are other variations of Eccosorb material, and there are other classes of materials that do not have high electrical resistivities. All such materials can, of course, be used as dielectrics between AC reference planes that have the same DC potential. There are important applications of this invention in which adjacent conducting planes may be at the same DC potential.

Figure 13:
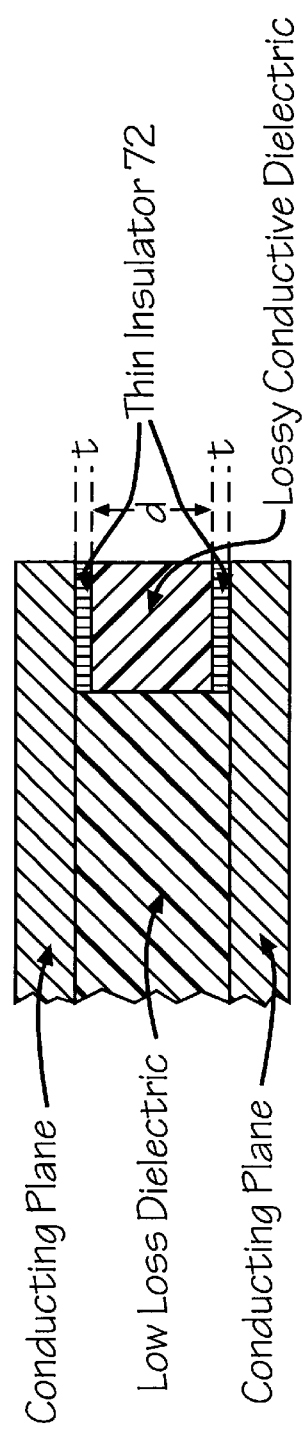
FIG. 13 illustrates a partial, sectional, schematic view of circuit planes having a low-loss, dielectric, absorbent material disposed therebetween.

Other electricity-conducting, absorbent materials besides Eccosorb include reticulated vitreous carbon and Duocel™ ceramic foam. Both of these products are manufactured by Energy Research and Generation, Inc. Duocel silicon carbide would also be useful. A third class of potentially important, electricity-absorbent materials applicable for this invention are the organic, polymeric conductors synthesized by Professor Wayne Jones of the Binghamton University Chemistry Department in Binghamton, N.Y. Electrically-conductive materials are nevertheless useful in this invention, even between conducting layers by simply inserting a high capacitor between each (or only one) side of the absorbent material and the conducting planes. This is illustrated in FIG. 13. The thin, insulator layers 72 in the structure shown in FIG. 13 form capacitors, which block DC current. In order for the capacitance added by the thin, insulator layers to be neglected in an equivalent circuit representation of this structure, the impedance of the capacitors must be an effective short circuit. The effective capacitance of these structures is ½ C, where C=KA/t, where K is the dielectric constant of the thin insulator, t is the thickness of the insulating layers, and A is the area. The impedance of the capacitors can be neglected if $\omega CR \gg 1$, where R is the resistance of the absorbing dielectric and $\omega$ is the lowest angular frequency of interest. R=pd/A, where R is the resistivity of the conducting material, d is its thickness, and A is the area. (A is the same as the area A for the capacitors in this simple configuration.)

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An electronic and electrical circuit structure having reduced switching noise, delta-I noise, LdI/dt noise, and simultaneous switching noise, comprising:

at least three conducting planes defining said electronic and electrical circuit structure; and noise-absorbent, lossy material disposed about non-noise-absorbent material at perimeters about, and strategic locations between said conducting planes of said electronic and electrical circuit structure, said noise-absorbent, lossy material having a substantially matching dielectric constant with that of a dielectric constant of said non-noise-absorbent matieral, said noise-absorbent material being disposed contiguously surrounding conducting lines and vias of said electronic and electrical circuit structure.

2. The electronic and electrical circuit structure in accordance with claim 1, wherein said noise-absorbent, lossy material is disposed in quadrants of said electronic and electrical circuit structure.

3. The electronic and electrical circuit structure in accordance with claim 1, wherein said noise-absorbent, lossy material is tapered at a perimeter of said electronic and electrical circuit structure.

4. The electronic and electrical circuit structure in accordance with claim 1, wherein said noise-absorbent, lossy material is selected from a group of materials consisting of reticulated vitreous carbon, silicon carbide, organic polymeric conductors, semiconductors and ceramic foams.

5. The electronic and electrical circuit structure in accordance with claim 1, wherein said noise-absorbent, lossy material comprises resistivities in the approximate range of between $10^{10}$ and $10^{12}$ ohm-cms.

* * * * *